United States Patent
Uchiho et al.

(10) Patent No.: US 12,308,276 B2
(45) Date of Patent: May 20, 2025

(54) TAPE PRESSURE BONDING APPARATUS

(71) Applicant: DISCO CORPORATION, Tokyo (JP)

(72) Inventors: Takashi Uchiho, Tokyo (JP);
Yoshinobu Saito, Tokyo (JP);
Yoshinori Kakinuma, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 457 days.

(21) Appl. No.: 18/053,861

(22) Filed: Nov. 9, 2022

(65) Prior Publication Data

US 2023/0154782 A1    May 18, 2023

(51) Int. Cl.
*H01L 21/683* (2006.01)
*H01L 21/687* (2006.01)

(52) U.S. Cl.
CPC ...... *H01L 21/6836* (2013.01); *H01L 21/6838* (2013.01); *H01L 21/68742* (2013.01)

(58) Field of Classification Search
CPC ........... H01L 21/67132; H01L 21/6836; H01L 21/68735; H01L 21/68771; H01L 21/6838; H01L 21/68742; H01L 2221/68327; H01L 21/67092; H01L 2221/68304

See application file for complete search history.

(56) References Cited

U.S. PATENT DOCUMENTS

| | | | | |
|---|---|---|---|---|
| 6,184,109 B1 * | 2/2001 | Sasaki | ................. | H01L 21/3043 438/464 |
| 8,486,806 B2 * | 7/2013 | Hirosawa | .......... | H01L 21/67132 438/464 |
| 9,245,778 B2 * | 1/2016 | Yamamoto | ........ | H01L 21/67132 |
| 11,651,988 B2 * | 5/2023 | Saito | ................. | H01L 21/68707 156/280 |
| 11,862,505 B2 * | 1/2024 | Kakinuma | .......... | H01L 21/6836 |
| 12,094,742 B2 * | 9/2024 | Saito | ..................... | H01L 21/681 |
| 2020/0075311 A1 * | 3/2020 | Osaga | ..................... | H01L 21/78 |
| 2022/0189800 A1 * | 6/2022 | Uchiho | ............. | B23K 26/0823 |
| 2023/0121008 A1 * | 4/2023 | Mori | ..................... | B23K 26/16 438/464 |

FOREIGN PATENT DOCUMENTS

JP      2010062375 A      3/2010

* cited by examiner

*Primary Examiner* — Eduardo A Rodela
(74) *Attorney, Agent, or Firm* — GREER BURNS & CRAIN, LTD.

(57) ABSTRACT

A tape pressure bonding apparatus includes an upper chamber, a lower chamber, a lifting mechanism that switches between a closed state in which the upper chamber is moved downward to be brought into contact with the lower chamber and an open state in which the upper chamber is separated from the lower chamber, a vacuum section that evacuates the upper chamber and the lower chamber, and an atmosphere opening section that opens the upper chamber and the lower chamber to the atmosphere. The lower chamber accommodates a wafer table that has a holding surface including a circular recess for supporting only a peripheral surplus region of the wafer and making a device region in a non-contact state. The tape pressure bonding apparatus includes a positive pressure generating section that supplies air into the circular recess of the wafer table to establish a positive pressure state in the circular recess.

3 Claims, 6 Drawing Sheets

TAPE PRESSURE BONDING APPARATUS

BACKGROUND OF THE INVENTION

Field of the Invention

The present invention relates to a tape pressure bonding apparatus for pressure bonding a tape that is pressure bonded to an annular frame having an opening for accommodating a wafer in a center of the annular frame to a back surface of the wafer.

Description of the Related Art

A wafer having a device region and a peripheral surplus region formed on a front surface thereof, the device region in which a plurality of devices such as integrated circuits (ICs) and large-scale integration circuits (LSIs) are partitioned by a plurality of intersecting streets, and the peripheral surplus region surrounding the device region. The back surface side of the wafer described above is ground, and the wafer is formed into a desired thickness and is thereafter divided into individual device chips by a dicing apparatus or a laser processing apparatus. Then, the device chips thus divided is utilized for electric equipment such as a mobile phone and a personal computer.

The present inventor has proposed a technology in which, for facilitating conveyance of a ground wafer, a ring-like reinforcement section is left on the back surface corresponding to the peripheral surplus region, and, after predetermined processing is conducted, a dicing tape is pressure bonded to the back surface of the wafer and the wafer is supported by an annular frame, and the ring-like reinforcement section is removed from the wafer (see, for example, Japanese Patent Laid-Open No. 2010-62375).

However, in the technology disclosed in Japanese Patent Laid-Open No. 2010-62375, there has been a problem in that an operation of pressure bonding the dicing tape to the back surface of the wafer formed with a ring-like reinforcement section at the periphery thereof and uniting the wafer with an annular frame through the dicing tape is difficult to be performed, and it is difficult to cut and remove the ring-like reinforcement section from the wafer, resulting in poor productivity.

To address this problem, it may be considered to utilize a wafer table that supports the front surface side of the wafer for an operation to attach the dicing tape to the back surface of the wafer to unit the wafer with the annular frame. To prevent damage to the device region formed on the front surface of the wafer, the wafer table is preferably formed with a circular recess that supports only the peripheral surplus region and that is not in contact with the device region.

SUMMARY OF THE INVENTION

However, the configuration in which only the peripheral surplus region on the front surface side of the wafer is supported by the wafer table having the circular recess and the tape of an annular frame attached with the tape is pressure bonded to the back surface of the wafer by a pressing roller may cause damage to the wafer.

Accordingly, it is an object of the present invention to provide a tape pressure bonding apparatus which would not damage a wafer even if a tape of an annular frame attached with the tape is pressure bonded to the back surface of the wafer by a pressing roller.

In accordance with an aspect of the present invention, there is provided a tape pressure bonding apparatus which pressure bonds a tape that is pressure bonded to an annular frame having an opening for accommodating a wafer in a center of the annular frame to a back surface of the wafer, the tape pressure bonding apparatus including an upper chamber, a lower chamber accommodating a wafer table that has a holding surface including a circular recess for supporting only a peripheral surplus region of the wafer and making a device region a non-contact state, a lifting mechanism that switches between a closed state in which the upper chamber is moved downward to be brought into contact with the lower chamber and an open state in which the upper chamber is separated from the lower chamber, a vacuum section that evacuates the upper chamber and the lower chamber in the closed state, an atmosphere opening section that opens the upper chamber and the lower chamber to the atmosphere, and positive pressure generating means that supplies air into the circular recess of the wafer table to establish a positive pressure state in the circular recess, the positive pressure state in which a pressure in the circular recess is made higher than a pressure in the upper chamber and the lower chamber. In a state in which a tape of the annular frame attached with the tape is positioned on the back surface of the wafer supported by the wafer table, the upper chamber and the lower chamber are evacuated while maintaining the closed state by operating the lifting mechanism, and the tape of the annular frame attached with the tape is pressure bonded to the back surface of the wafer by a pressing roller disposed in the upper chamber.

Preferably, the positive pressure generating means may operate when the pressing roller presses the wafer through the tape. A ring-like reinforcement section may be formed in a projecting manner on the back surface corresponding to the peripheral surplus region of the wafer.

The tape pressure bonding apparatus of the present invention includes the positive pressure generating means that supplies air into the circular recess of the wafer table to establish a positive pressure state in the circular recess, the positive pressure state in which a pressure in the circular recess is made higher than a pressure in the upper chamber and the lower chamber, and therefore, the tape pressure bonding apparatus would not damage the wafer even if the tape of the annular frame attached with the tape is pressure bonded to the back surface of the wafer by the pressing roller.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

A tape pressure bonding apparatus of an embodiment of the present invention will be described with reference to the drawings.

(Tape Pressure Bonding Apparatus 2)

Figure 1:
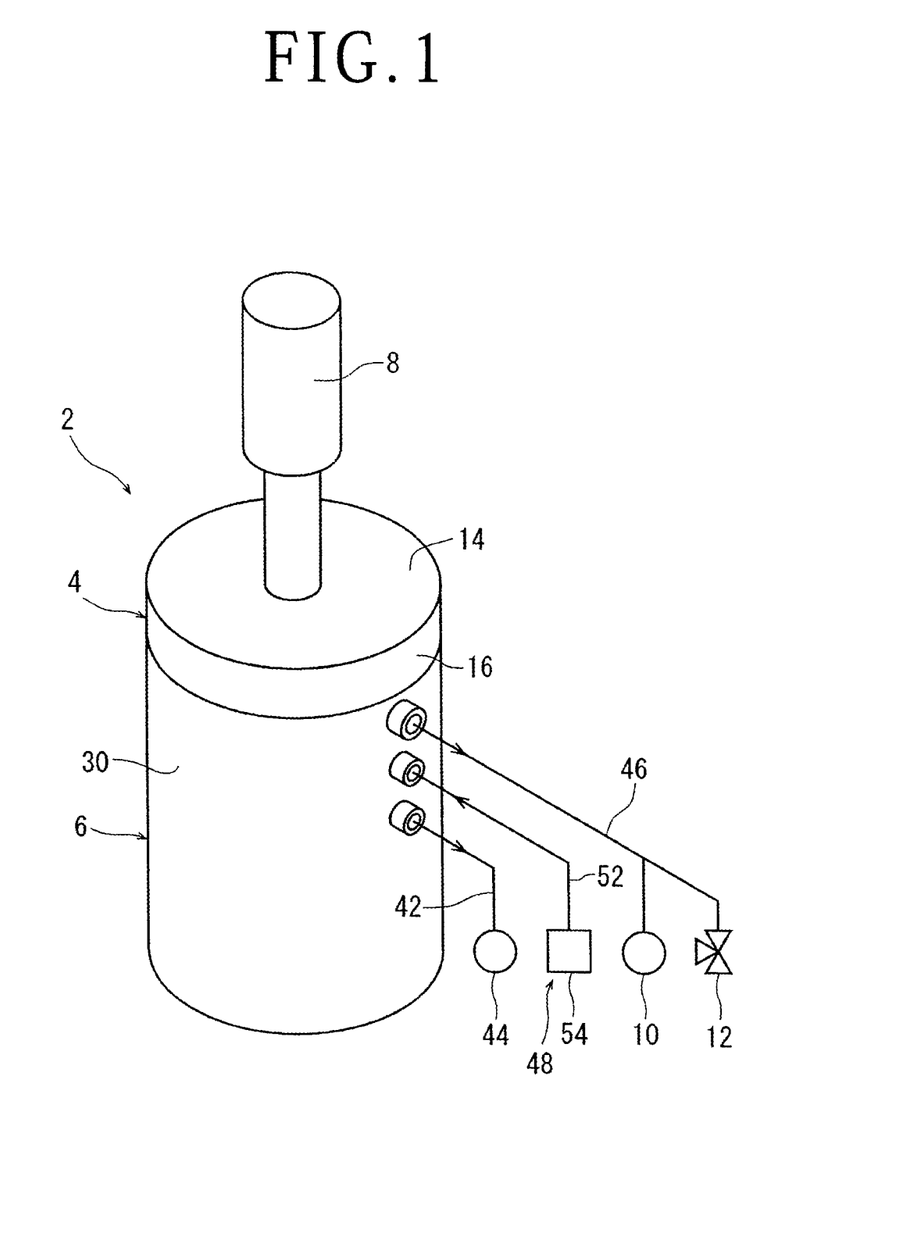
FIG. 1 is a perspective view of a tape pressure bonding apparatus of an embodiment of the present invention.

As illustrated in FIG. 1, the tape pressure bonding apparatus 2 includes an upper chamber 4, a lower chamber 6, a lifting mechanism 8 that switches between a closed state in which the upper chamber 4 is moved downward to be brought into contact with the lower chamber 6 and an open state in which the upper chamber 4 is separated from the lower chamber 6, a vacuum section 10 that evacuates the upper chamber 4 and the lower chamber 6 in the closed state, and an atmosphere opening section 12 that opens the upper chamber 4 and the lower chamber 6 to the atmospheric air.

(Upper Chamber 4)

Figure 2:
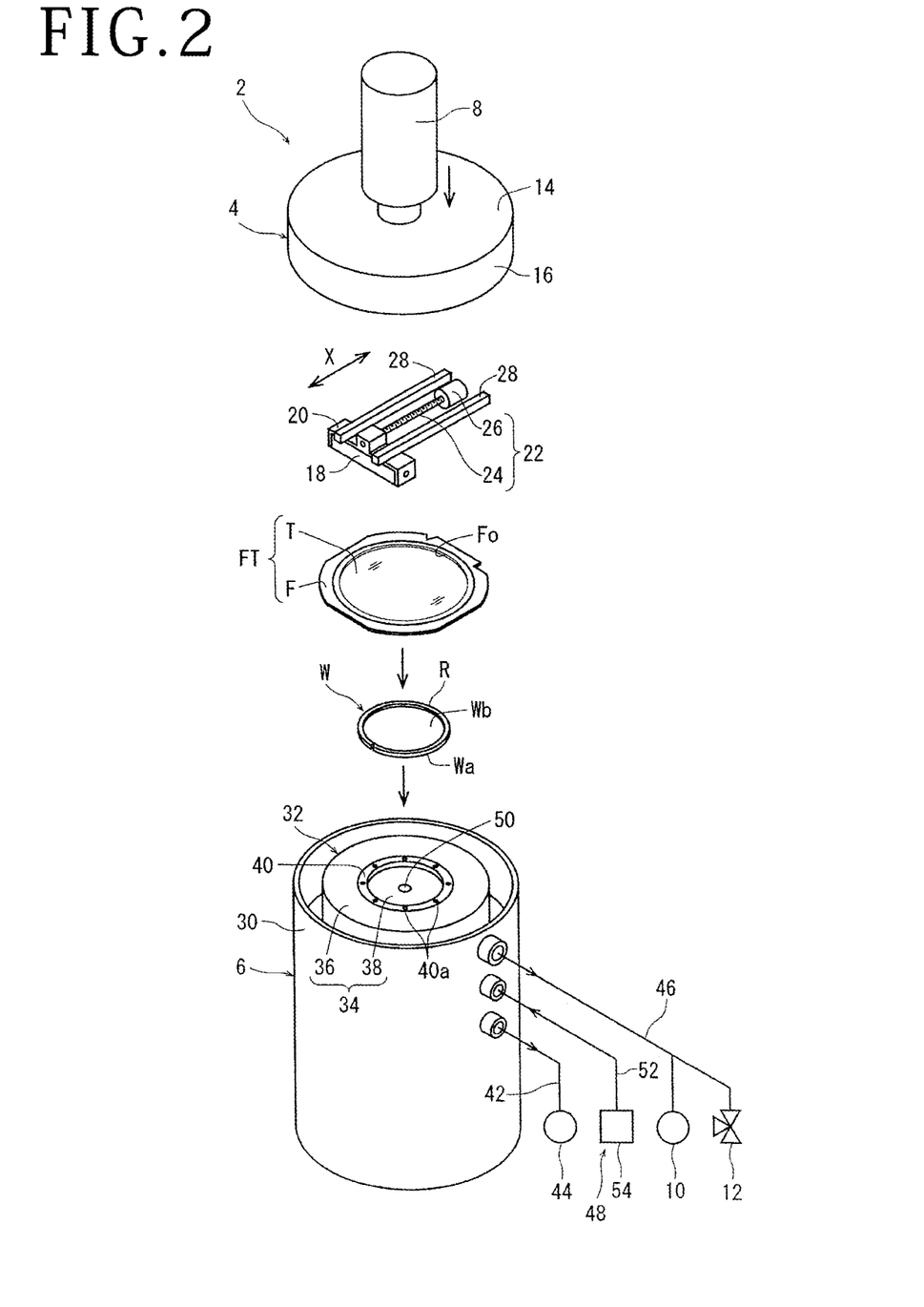
FIG. 2 is an exploded perspective view of the tape pressure bonding apparatus depicted in FIG. 1.
Figure 3:
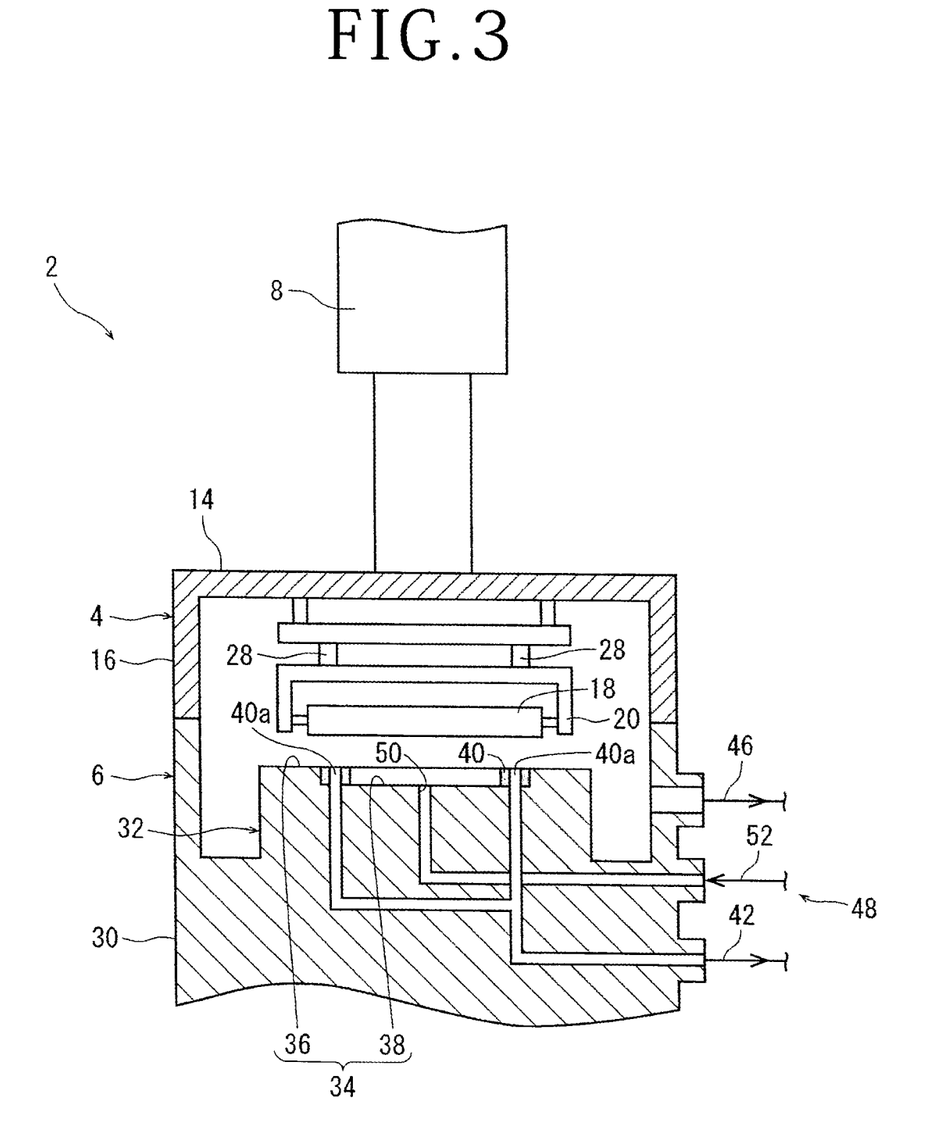
FIG. 3 is a sectional view of the tape pressure bonding deice depicted in FIG. 1.

The upper chamber 4 includes a circular top plate 14, and a cylindrical side wall 16 extending downward from a peripheral edge of the top plate 14, and a lower part of the side wall 16 is opened. Referring to FIGS. 2 and 3, in an accommodating space defined by a lower surface of the top plate 14 and an inner peripheral surface of the side wall 16, there are disposed a pressing roller 18 for pressure bonding a tape of an annular frame attached with the tape to a wafer, a support piece 20 that rotatably supports the pressing roller 18, and an X-axis feeding mechanism 22 (see FIG. 2) that moves the support piece 20 in an X-axis direction indicated by an arrow X in FIG. 2.

As depicted in FIG. 2, the X-axis feeding mechanism 22 includes a ball screw 24 connected to the support piece 20 and extending in the X-axis direction, and a motor 26 for rotating the ball screw 24. The X-axis feeding mechanism 22 converts a rotational motion of the motor 26 into a rectilinear motion and transmits the rectilinear motion to the support piece 20 by the ball screw 24, thereby moving the pressing roller 18 together with the support piece 20 along a pair of guide rails 28 extending in the X-axis direction.

(Lower Chamber 6)

As illustrated in FIGS. 2 and 3, the lower chamber 6 has a cylindrical side wall 30. The side wall 30 is opened at an upper part and is closed at a lower part. A wafer table 32 that holds the wafer and the annular frame is accommodated in the side wall 30.

The wafer table 32 has a holding surface 34 formed in a recessed shape so as to hold only a peripheral surplus region of the wafer and to make a device region a non-contact state. The holding surface 34 includes an annular holding section 36 hat holds the peripheral surplus region of the wafer and the annular frame, and a circular recess 38 corresponding to the device region. The annular holding section 36 has a rubber ring 40 disposed along a peripheral edge of the circular recess 38, and the rubber ring 40 is provided with a plurality of suction holes 40a at intervals along a circumferential direction. Each of the suction holes 40a is connected to a suction source 44 (see FIG. 2) through a channel 42.

(Lifting Mechanism 8, Vacuum Section 10, Atmosphere Opening Section 12)

The lifting mechanism 8 can be configured by an appropriate actuator such as an air cylinder mounted to an upper surface of the top plate 14 of the upper chamber 4. The vacuum section 10 can be configured by an appropriate vacuum pump. The vacuum section 10 is connected to the lower chamber 6 through a channel 46. In addition, the channel 46 is provided with the atmosphere opening section 12 including an appropriate valve capable of opening the channel 46 to the atmospheric air.

(Positive Pressure Generating Means 48)

Continuing a description with reference to FIGS. 2 and 3, the tape pressure bonding apparatus 2 of the present embodiment includes positive pressure generating means 48 that supplies air into the region (circular recess 38) of the wafer table 32 formed in a recessed shape to establish a positive pressure state in the circular recess 38, i.e., to make a pressure in the circular recess 38 higher than a pressure in the upper chamber 4 and the lower chamber 6. The positive pressure generating means 48 includes a supply hole 50 formed in the circular recess 38 and an air supply source 54 (see FIG. 2) connected to the supply hole 50 through a channel 52.

(Wafer W)

Figure 4A:
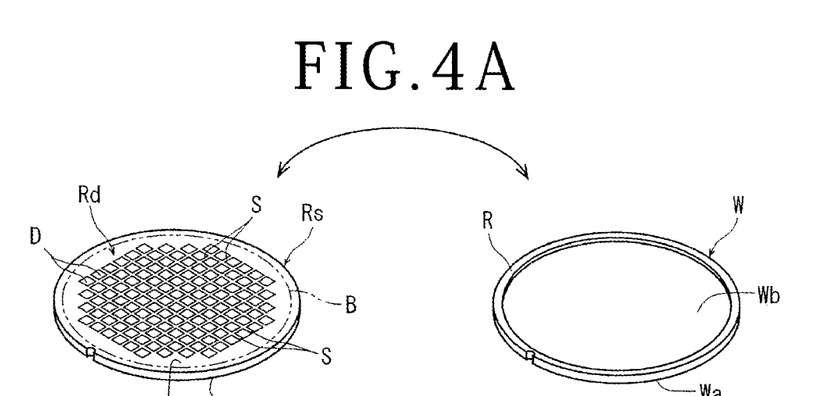
FIG. 4A is a perspective view of a wafer with a reinforcement section.

FIG. 4A depicts a disc-like wafer W to be pressure bonded to the tape of the annular frame attached with the tape by the tape pressure bonding apparatus 2. The wafer W can be formed of an appropriate semiconductor material such as silicon (Si) and silicon carbide (SiC). A front surface Wa of the wafer W has a circular device region Rd and a peripheral surplus region Rs surrounding the device region Rd. The device region Rd is partitioned by streets S in a grid pattern into a plurality of rectangular regions, and a device D such as an IC and an LSI is formed in each of the rectangular regions. Note that a boundary B between the device region Rd and the peripheral surplus region Rs is represented by alternate long and two short dash line as a matter of convenience, but in practice, the boundary B is not present.

For the wafer W depicted in FIG. 4A, a ring-like reinforcement section R is formed in a projecting manner on a back surface Wb corresponding to the peripheral surplus region Rs. Therefore, a thickness of the peripheral surplus region Rs is greater than a thickness of the device region Rd.

Figure 4B:
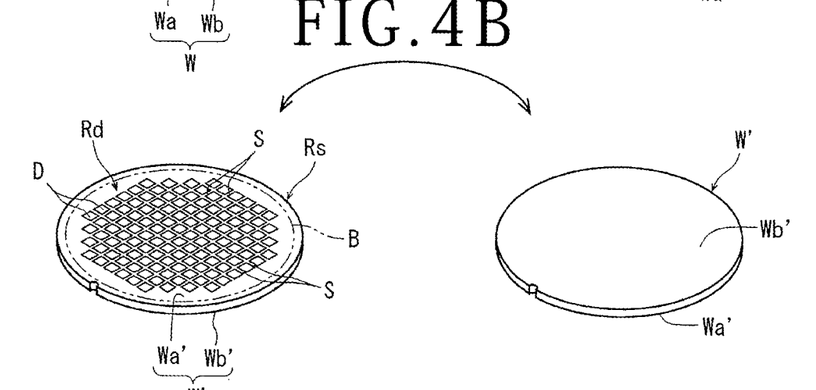
FIG. 4B is a perspective view of a wafer without a reinforcement section.

In addition, the wafer to be pressure bonded to the tape of the annular frame attached with the tape by the tape pressure bonding apparatus 2 may be a wafer, like a wafer W' depicted in FIG. 4B, not provided with the ring-like reinforcement section on a back surface Wb' of the wafer W'. Note that, in the following description, a case of pressure bonding the tape to the wafer W provided with the reinforcement section R will be mainly described.

(Annular Frame Attached with Tape FT)

Figure 5:
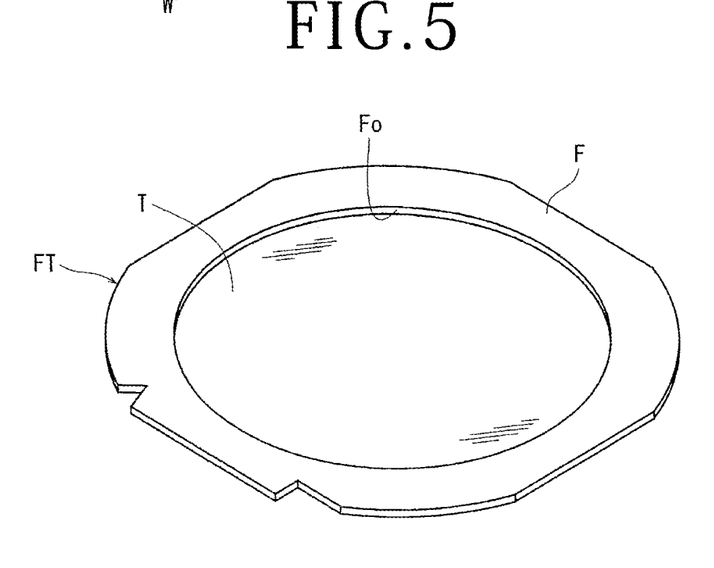
FIG. 5 is a perspective view of an annular frame attached with a tape.

FIG. 5 depicts an annular frame attached with a tape FT to which the wafer W is to be pressure bonded. The annular frame attached with the tape FT includes an annular frame F having an opening Fo for accommodating the wafer W, and a circular adhesive tape T pressure bonded to the annular frame F.

Next, the operation of the tape pressure bonding apparatus 2 as described above will be described.

In the present embodiment, first, the lifting mechanism 8 is operated to establish an open state in which the upper chamber 4 is separated from the lower chamber 6. Next, as depicted in FIG. 2, the wafer W is placed on the holding surface 34 of the wafer table 32 in a state in which the front surface Wa formed with the devices D is directed downward.

At a time of placing the wafer W on the holding surface 34, the peripheral surplus region Rs of the wafer W is positioned at the rubber ring 40 of the annular holding section 36, and the device region Rd of the wafer W is positioned at the circular recess 38. As a result, even when the wafer W is placed on the holding surface 34 of the wafer table 32 in a state in which the front surface Wa formed with the devices D is directed downward, the devices D in the device region Rd and the holding surface 34 are not brought into contact with each other, and damaging of the devices D can be prevented.

Next, the suction source 44 is operated, to generate a suction force in each suction hole 40a of the rubber ring 40, thereby holding under suction the peripheral surplus region Rs of the wafer W. The pressure in the suction holes 40a at this time may be, for example, an absolute pressure of substantially 100 Pa.

When the wafer W is held under suction by the wafer table 32, the annular frame attached with the tape FT is placed on the annular holding section 36 of the wafer table 32 (see FIG. 2). At this time, the tape T of the annular frame attached with the tape FT is positioned on the back surface Wb of the wafer W supported by the wafer table 32, and an adhesive surface of the tape T is directed downward such that the adhesive surface of the tape T faces the back surface Wb of the wafer W.

After the annular frame attached with the tape FT is placed on the wafer table 32, the upper chamber 4 is lowered by the lifting mechanism 8, and a lower end of the side wall 16 of the upper chamber 4 is brought into contact with an upper end of the side wall 30 of the lower chamber 6 (see FIG. 3). As a result, the upper chamber 4 and the lower chamber 6 are put into a closed state. Then, as depicted in FIG. 6, the pressing roller 18 comes in contact with the annular frame attached with the tape FT, and the adhesive surface of the tape T comes in contact with an upper end of the reinforcement section R of the wafer W.

Next, the vacuum section 10 is operated in a state in which the atmosphere opening section 12 is closed, to evacuate the inside of the upper and lower chambers 4 and 6. It is to be noted that the pressure in the upper and lower chambers 4 and 6 is set higher than the pressure in the suction holes 40a (for example, an absolute pressure of substantially 200 Pa). As a result, although a force for sucking the wafer W is slightly weakened, a state in which the wafer W is held under suction by the wafer table 32 can be maintained, even if the upper and lower chambers 4 and 6 are evacuated.

Figure 6:
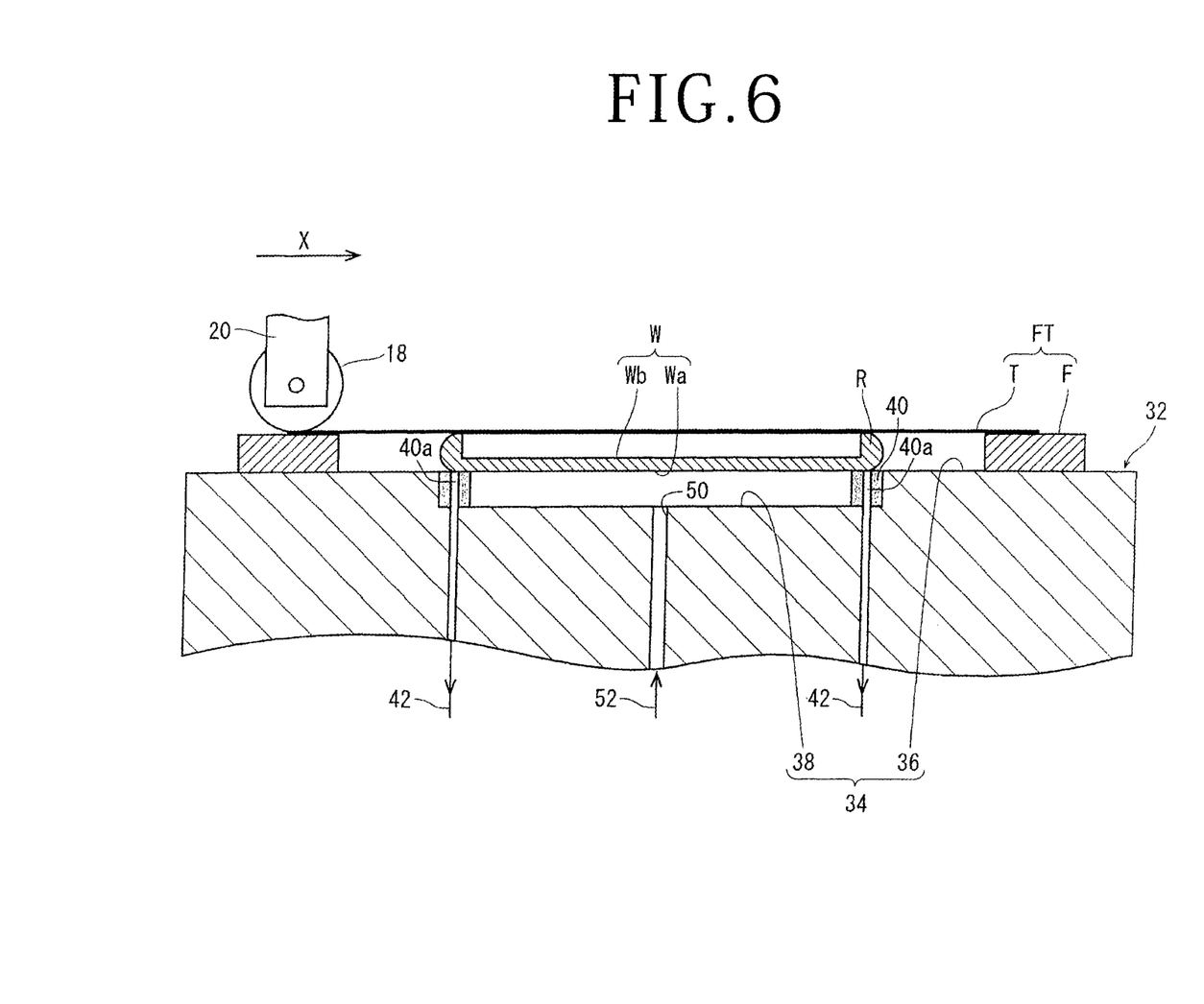
FIG. 6 is a schematic sectional view depicting a state in which pressing of the tape is started.
Figure 7:
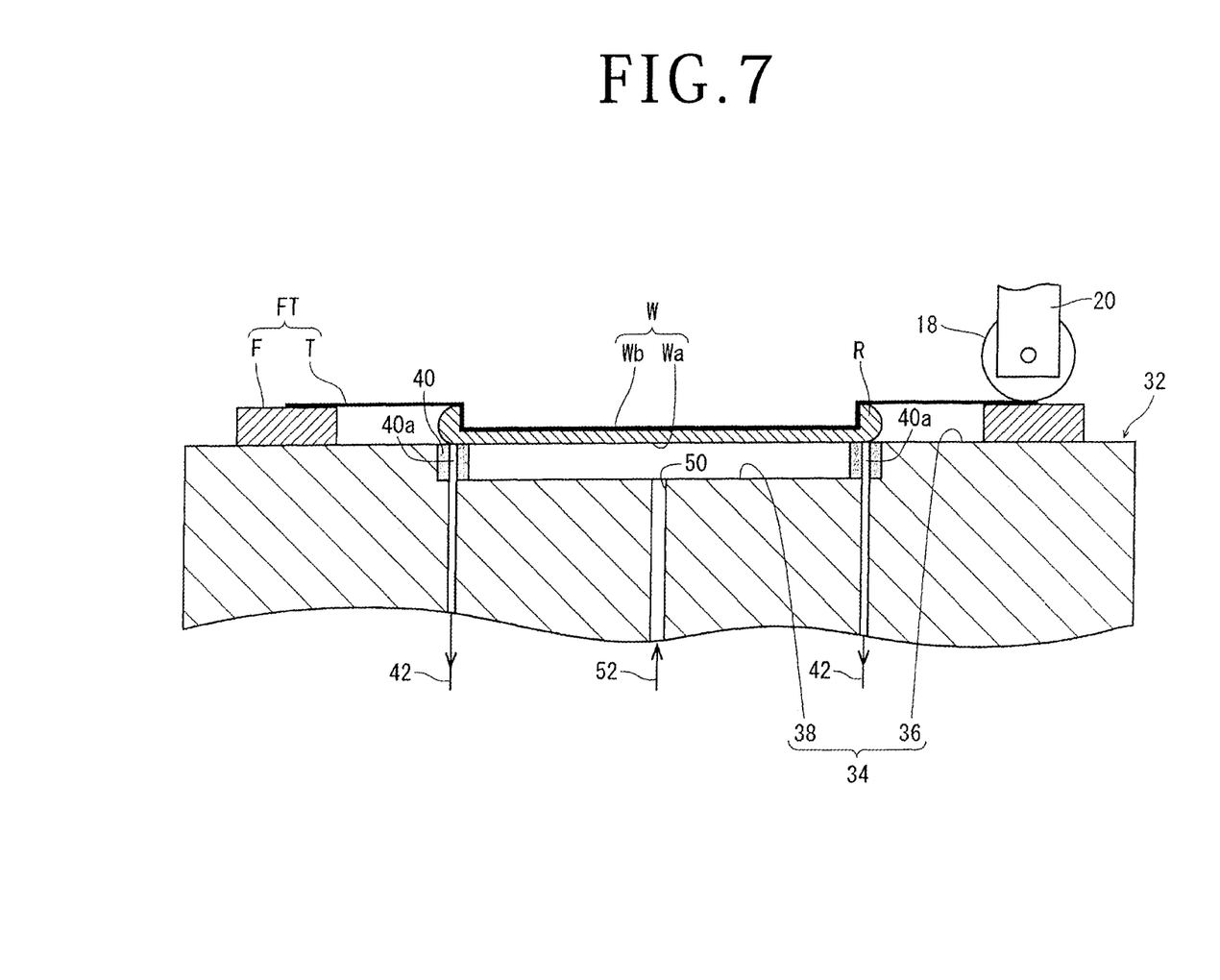
FIG. 7 is a schematic sectional view depicting a state in which pressing of the tape is finished.

Subsequently, as depicted in FIGS. 6 and 7, the pressing roller 18 disposed in the upper chamber 4 is rolled in the X-axis direction by the X-axis feeding mechanism 22, and the tape T of the annular frame attached with the tape FT is pressure bonded to the back surface Wb of the wafer W by the pressing roller 18. At this time, the wafer W is pressed downward through the tape T by the pressing roller 18. Then, since the wafer W has only the peripheral surplus region Rs supported by the rubber ring 40 of the annular holding section 36 and the device region Rd is positioned at the circular recess 38, the wafer w is warped downward at a result of the pressing by the pressing roller 18, and the wafer W may be broken.

However, since the tape pressure bonding apparatus 2 of the present embodiment is provided with the positive pressure generating means 48 that supplies air into the circular recess 38 to establish a positive pressure state in the circular recess 38, the positive pressure state in which the pressure in the circular recess 38 is made higher than the pressure in the upper and lower chambers 4 and 6, the wafer W can be prevented from being warped due to the pressing by the pressing roller 18 and can be prevented from being broken.

Specifically, when the wafer W is pressed by the pressing roller 18 through the tape T, the air supply source 54 of the positive pressure generating means 48 is operated, to supply air into the circular recess 38 through the supply hole 50, thereby putting the circular recess 38 into a positive pressure state, the positive pressure state in which the pressure in the circular recess 38 is made higher than the pressure in the upper and lower chambers 4 and 6. At this time, the pressure in the circular recess 38 is set slightly greater than the pressure in the upper and lower chambers 4 and 6. For example, in a case where the air pressure in the upper and lower chambers 4 and 6 is an absolute pressure of substantially 200 Pa, the air pressure in the circular recess 38 may be an absolute pressure of substantially 300 Pa.

In this way, in the tape pressure bonding apparatus 2 of the present embodiment, since the pressure in the circular recess 38 is made more positive (higher) than the pressure in the upper and lower chambers 4 and 6 by the positive pressure generating means 48, when the wafer W is pressed by the pressing roller 18 through the tape T, the wafer W can be prevented from being warped, and the wafer W can be prevented from being broken.

When the tape T is pressure bonded to the wafer W by the pressing roller 18, if the upper and lower chambers 4 and 6 are evacuated, the suction force for the wafer W by the wafer table 32 would be weakened, as mentioned above. However, in the present embodiment, the peripheral surplus region Rs of the wafer W is positioned at the rubber ring 40 of the annular holding section 36. Hence, when the tape T is pressure bonded to the wafer W by the pressing roller 18, positional deviation of the wafer W is prevented by a frictional force between the rubber ring 40 and the wafer W.

In the present embodiment, the back surface Wb of the wafer W is formed with the ring-like reinforcement section R. Accordingly, even when the tape T is pressure bonded to the back surface Wb of the wafer W by the pressing roller 18, a part with which the tape T is not in close contact may be generated at a root of the ring-like reinforcement section R.

In this regard, in the present embodiment, the tape T is pressure bonded to the wafer W by the pressing roller 18 in a state in which the upper and lower chambers 4 and 6 are evacuated. Hence, when the atmosphere opening section 12 is opened after the pressing roller 18 is moved, the tape T can be pressed to the wafer W by the atmospheric pressure, and the tape T can be put into close contact with the wafer W along the root of the reinforcement section R.

Note that, in the present embodiment, a case in which the tape T is an adhesive tape has been described, but the tape T may be a thermocompression bonding tape in which an adhesive layer is not formed on a sheet included in the tape. The thermocompression bonding tape is a tape of a thermoplastic synthetic resin (for example, a polyolefin resin), which exhibits an adhesive force by being soften or melted when heated to a temperature in the vicinity of the melting point thereof.

In a case in which the tape T is a thermocompression bonding tape, the tape T can be thermocompression bonded to the back surface Wb of the wafer W by the pressing roller 18, by heating at least one of the pressing roller 18 or the wafer table 32 to a temperature at which the tape T is softened or melted.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A tape pressure bonding apparatus which pressure bonds a tape that is pressure bonded to an annular frame having an opening for accommodating a wafer in a center of the annular frame to a back surface of the wafer, the tape pressure bonding apparatus comprising:
    an upper chamber;
    a lower chamber accommodating a wafer table that has a holding surface including a circular recess for supporting only a peripheral surplus region of the wafer and making a device region a non-contact state;
    a lifting mechanism that switches between a closed state in which the upper chamber is moved downward to be brought into contact with the lower chamber and an open state in which the upper chamber is separated from the lower chamber;
    a vacuum section that evacuates the upper chamber and the lower chamber in the closed state;
    an atmosphere opening section that opens the upper chamber and the lower chamber to the atmosphere; and
    positive pressure generating means that supplies air into the circular recess of the wafer table to establish a positive pressure state in the circular recess, the positive pressure state in which a pressure in the circular recess is made higher than a pressure in the upper chamber and the lower chamber,
    wherein, in a state in which a tape of the annular frame attached with the tape is positioned on the back surface of the wafer supported by the wafer table, the upper chamber and the lower chamber are evacuated while maintaining the closed state by operating the lifting mechanism, and the tape of the annular frame attached with the tape is pressure bonded to the back surface of the wafer by a pressing roller disposed in the upper chamber.

2. The tape pressure bonding apparatus according to claim 1,
    wherein the positive pressure generating means operates when the pressing roller presses the wafer through the tape.

3. The tape pressure bonding apparatus according to claim 1,
    wherein a ring-like reinforcement section is formed in a projecting manner on the back surface corresponding to the peripheral surplus region of the wafer.

* * * * *